(12) United States Patent
Chiang et al.

(10) Patent No.: US 10,199,320 B2
(45) Date of Patent: Feb. 5, 2019

(54) METHOD OF FABRICATING ELECTRONIC PACKAGE

(71) Applicant: Siliconware Precision Industries Co., Ltd., Taichung (TW)

(72) Inventors: Ching-Wen Chiang, Taichung (TW); Kuang-Hsin Chen, Taichung (TW); Sheng-Li Lu, Taichung (TW); Hsien-Wen Chen, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 15/784,782

(22) Filed: Oct. 16, 2017

(65) Prior Publication Data

US 2018/0040550 A1 Feb. 8, 2018

Related U.S. Application Data

(62) Division of application No. 14/817,233, filed on Aug. 4, 2015, now Pat. No. 9,818,683.

(30) Foreign Application Priority Data

Dec. 5, 2014 (TW) .............................. 103142314 A

(51) Int. Cl.
*H01L 23/498* (2006.01)
*H01L 21/56* (2006.01)
(Continued)

(52) U.S. Cl.
CPC ...... *H01L 23/49838* (2013.01); *H01L 21/486* (2013.01); *H01L 21/56* (2013.01); *H01L 21/561* (2013.01); *H01L 21/568* (2013.01); *H01L 23/13* (2013.01); *H01L 23/3121* (2013.01); *H01L 23/49816* (2013.01); *H01L 23/49822* (2013.01); *H01L 23/49827* (2013.01); *H01L 23/49833* (2013.01); *H01L 23/5389* (2013.01);
(Continued)

(58) Field of Classification Search
CPC ............ H01L 23/498; H01L 23/49838; H01L 23/49816; H01L 23/49822
See application file for complete search history.

(56) References Cited

U.S. PATENT DOCUMENTS

| | | | |
|---|---|---|---|
| 5,742,100 A | 4/1998 | Schroeder et al. | |
| 7,112,520 B2 * | 9/2006 | Lee ...................... | H01L 21/486 257/E23.004 |

(Continued)

*Primary Examiner* — Phuc T Dang
(74) *Attorney, Agent, or Firm* — Mintz Levin Cohn Ferris Glovsky and Popeo, P.C.; Peter F. Corless; Steven M. Jensen

(57) ABSTRACT

A method of fabricating an electronic package is provided, including: providing a carrier body having a first surface formed with a plurality of recessed portions, and a second surface opposing the first surface and interconnecting with the recessed portions; forming on the first surface of the carrier body an electronic structure that has a plurality of conductive elements received in the recessed portions correspondingly; and removing portion of the carrier body, with the conductive elements exposed from the second surface of the carrier body. Therefore, the carrier body is retained, and the fabrication cost is reduced since temporary material is required. The present invention further provides the electronic package thus fabricated.

13 Claims, 6 Drawing Sheets

(51) Int. Cl.
  *H01L 23/00* (2006.01)
  *H01L 21/48* (2006.01)
  *H01L 23/31* (2006.01)
  *H01L 23/538* (2006.01)
  *H01L 23/13* (2006.01)

(52) U.S. Cl.
  CPC .... *H01L 24/19* (2013.01); *H01L 2224/04105* (2013.01); *H01L 2224/12105* (2013.01); *H01L 2224/16225* (2013.01); *H01L 2224/16227* (2013.01); *H01L 2224/18* (2013.01); *H01L 2224/19* (2013.01); *H01L 2224/20* (2013.01); *H01L 2224/92144* (2013.01); *H01L 2225/1035* (2013.01); *H01L 2225/1041* (2013.01); *H01L 2225/1058* (2013.01); *H01L 2924/15153* (2013.01); *H01L 2924/15311* (2013.01); *H01L 2924/181* (2013.01)

(56) References Cited

U.S. PATENT DOCUMENTS

| | | | |
|---|---|---|---|
| 9,059,160 B1* | 6/2015 | Sutardja | H01L 23/49894 |
| 9,184,104 B1 | 11/2015 | Chia et al. | |
| 2002/0063319 A1* | 5/2002 | Huang | H01L 21/563 |
| | | | 257/678 |
| 2003/0164540 A1 | 9/2003 | Lee et al. | |
| 2003/0164548 A1* | 9/2003 | Lee | H01L 23/13 |
| | | | 257/738 |
| 2003/0164551 A1 | 9/2003 | Lee et al. | |
| 2008/0176393 A1* | 7/2008 | Mackay | B23K 1/0016 |
| | | | 438/613 |
| 2014/0284791 A1 | 9/2014 | Do et al. | |
| 2015/0340327 A1* | 11/2015 | Uzoh | H01L 24/02 |
| | | | 257/723 |
| 2016/0042978 A1* | 2/2016 | Wang | H01L 25/50 |
| | | | 257/773 |
| 2016/0240503 A1* | 8/2016 | Shu | H01L 23/3142 |

* cited by examiner

METHOD OF FABRICATING ELECTRONIC PACKAGE

CROSS-REFERENCE TO RELATED APPLICATION(S)

This application is a divisional of copending application U.S. Ser. No. 14/817,233, filed on Aug. 4, 2015, U.S. Pat. No. 9,818,683, which claims under 35 U.S.C. § 119(a) the benefit of Taiwanese Application No. 103142314, filed Dec. 5, 2014, the entire contents of which are incorporated herein by reference.

BACKGROUND OF THE INVENTION

1. Field of the Invention

The present invention relates to electronic packages, and, more particularly, to an electronic package with reduced fabrication cost, and a method of fabricating the electronic package.

2. Description of Related Art

As the electronic industry is rapidly advancing, electronic products are required to have multi-functionality and high performance. Accordingly, a variety of packaging techniques are brought to the market, including flip chip type package such as chip scale package (CSP), direct chip attached (DCA) or multi-chip Module (MCM) or 3D chip stacking type package (3D IC).

FIG. 1 is a cross-sectional view showing a method of fabricating a semiconductor package 1 of a conventional 3D chip stacking type. A through silicon interposer (TSI) 10 is provided. The through silicon interposer 10 has a chip mounting side 10a, a switching side 10b opposing the chip mounting side 10a, and a plurality of through-silicon vias (TSV) 100 coupled with the chip mounting side 10a and the switching side 10b. A redistribution layer (RDL) 101 is formed on the switching side 10b. Electrode pads 190 of the semiconductor chip 19 with smaller spacing are electrically connected onto the chip mounting side 10a via a plurality of solder bumps 102. An underfill 192 encapsulates the solder bumps 102. An encapsulant 18 is formed on the through silicon interposer 10 and encapsulates the semiconductor chip 19. A plurality of conductive elements 103 such as bumps are formed on the redistribution layer 101 and electrically connected with the bonding pads 170 of the package substrate 17 with larger spacing. An underfill 172 encapsulates the conductive elements 103.

A typical method of fabricating the semiconductor package 1 is described as follows. The through silicon interposer 10 having a plurality of recessed portions (not shown) is mounted on a first carrier (such as a wafer, not shown). Then, the conductive elements 103 are received in the recessed portions correspondingly via an adhesive, for positioning the through silicon interposer 10. Subsequently, the semiconductor chip 19 is mounted on the through silicon interposer 10, and is electrically connected with the through silicon interposer 10 via the solder bumps 102. A second carrier (not shown) is then attached to the semiconductor chip 19, followed by a chip-flipping process, and then the first carrier and the adhesive is removed. After the chip-flipping process is performed, the through silicon interposer 10 is attached to the package substrate 17 via the conductive elements 103, followed by removing the second carrier and the adhesive, and then the encapsulant 18 is formed.

However, the method of fabricating the semiconductor package 1 requires that the carrier and the adhesive be attached and removed and the flipping process be performed many times. The method is thus complicated, and the semiconductor package 1 fabricated has a high cost.

Thus, there is an urgent need for solving the foregoing problems.

SUMMARY OF THE INVENTION

In view of the foregoing drawbacks of the prior art, the present invention provides an electronic package, comprising: a carrier body having a first surface formed with a plurality of recessed portions, and a second surface opposing the first surface and interconnecting with the recessed portions; an electronic structure formed on the first surface of the carrier body; and a plurality of conductive elements formed in the electronic structure, received in the recessed portions correspondingly, and exposed from the second surface of the carrier body.

The present invention further provides a method of fabricating an electronic package, comprising: providing a carrier body having a first surface, a second surface opposing the first surface, and a plurality of recessed portions formed via the first surface; forming on the first surface of the carrier body an electronic structure that has a plurality of conductive elements, in a manner that the conductive elements are received in the recessed portions after the electronic structure is formed on the carrier body; and removing a portion of the carrier body from the second surface, allowing the conductive elements to be exposed from the second surface of the carrier body.

In an embodiment, the carrier body is a semiconductor board.

In an embodiment, the electronic structure comprises at least one interposer having the conductive elements, an electronic element formed on the interposer, and an insulating layer that encapsulates the interposer and the electronic element, wherein the conductive element protrudes from the insulating layer.

In an embodiment, the conductive elements are secured to the recessed portions via a bonding material.

In an embodiment, the portion of the carrier body is removed from the second surface by a leveling method, and the surface of the conductive element is flush with the second surface of the carrier body.

In an embodiment, the portion of the carrier body is removed from the second surface by forming in the carrier body a plurality of openings that communicate with the recessed portions correspondingly, and the conductive elements are exposed from the openings. In another embodiment, conductors are formed in the openings.

In an embodiment, the electronic structure is an active component, a passive component, or a combination thereof.

In an embodiment, the carrier body is further formed with a recess via the first surface thereof, so as for the electronic structure to be formed in the recess, and for the recessed portions to communicate with the recess. In another embodiment, an insulating layer is formed in the recess for encapsulating the electronic structure.

In an embodiment, a plurality of conductive vias are formed in the carrier body.

In an embodiment, a wiring structure is formed on the first surface of the carrier.

In summary, the method of fabricating the electronic package according to the present invention is characterized by forming on the electronic structure conductive elements that are received in the recessed portions correspondingly. Therefore, the carrier body is retained, without the need of removing the carrier body. In other words, no temporary material (such as the carrier in the prior art and an adhesive) is required. Compared with the prior art, the present invention requires less steps and less time for production, does not consume materials for making the carrier, and has the fabrication cost reduced.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "top", "one" and etc., are merely for illustrative purpose and should not be construed to limit the scope of the present invention.

FIGS. 2A-2D are schematic cross-sectional views showing a method of fabricating an electronic package according to a first embodiment of the present invention.

Figure 1:
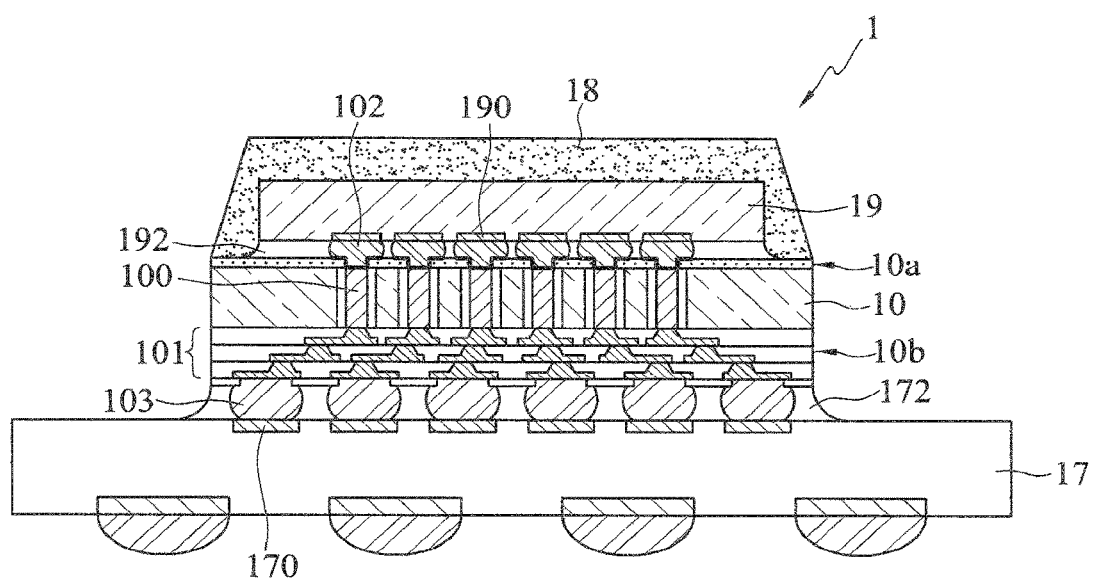
FIG. 1 is a schematic cross-sectional view of a semiconductor package according to the prior art.
Figure 2A:
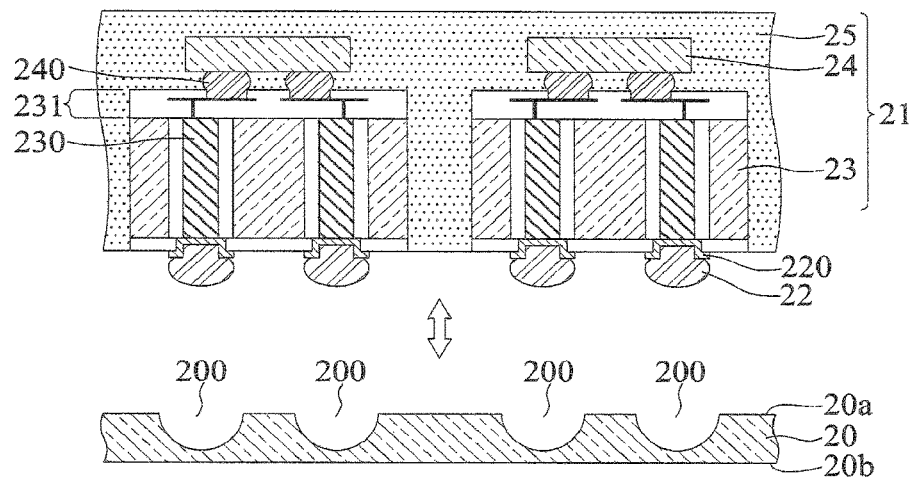
FIGS. 2A-2D are schematic cross-sectional views showing a method of fabricating an electronic package according to a first embodiment of the present invention.

As shown in FIG. 2A, an electronic structure 21 is provided that has a plurality of conductive elements 22, and a carrier body 20 having a first surface 20a and an opposing second surface 20b. A plurality of recessed portions 200 are formed in the carrier body 20 via the first surface 20a thereof.

In an embodiment, the carrier body 20 is a semiconductor board such as a silicon wafer (Si wafer), the electronic structure 21 comprises a plurality of interposers 23 having the conductive elements 22, a plurality of electronic elements 24 formed on the interposer 23, and an insulating layer 25 that encapsulates the interposer 23 and the electronic elements 24, and the conductive elements 22 protrude from the insulating layer 25.

In an embodiment, the interposer 23 has a plurality of conductive vias 230 and at least one redistribution layer (RDL) 23 electrically connected with the conductive vias 230, the electronic elements 24 are active components, passive components, or a combination thereof, the active components are semiconductor chips, and the passive components are resistors, capacitors and inductors. In another embodiment, the electronic element 24 is a semiconductor chip, and is electrically connected with the redistribution layer 231 via the solder bumps 240.

Further, the insulating layer 25 is made of a polyimide (PI), a dry film, an epoxy resin, or an encapsulating material.

In an embodiment, an under bump metallurgy (UBM) 220 is selectively formed between the conductive vias 230 and the conductive elements 22. In other words, each of the conductive elements 22 is formed on the terminal of a corresponding one of the conductive vias 230. The conductive elements 22 can be solder balls or other type of metal objects (such as copper columns), without being limited to a particular kind.

Figure 2B:
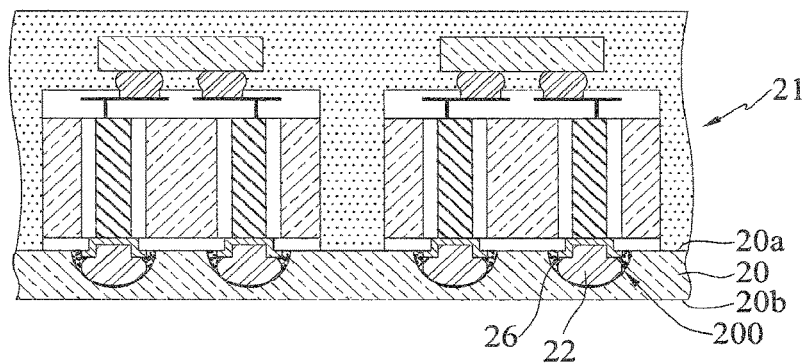

As shown in FIG. 2B, the electronic structure 21 is formed on the first surface 20a of the carrier body 20, and the conductive elements 22 are received in the recessed portions 200 correspondingly.

In an embodiment, the conductive elements 22 are secured to the recessed portion 200 via a bonding material 26 such as an underfill, such that the electronic structure 21 is fixed to the first surface 20a of the carrier body 20.

Figure 2C:
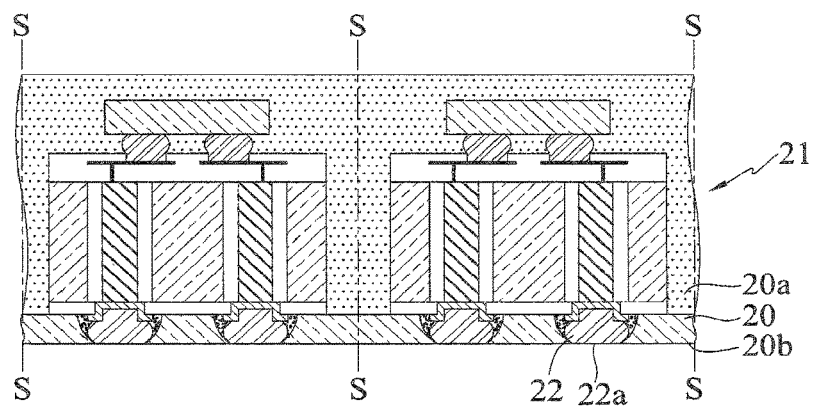

As shown in FIG. 2C, a portion of the carrier body 20 is removed from the second surface 20b, allowing the conductive elements 22 to be exposed from the second surface 20b of the carrier body 20.

In an embodiment, the portion of the carrier body 20 is removed from the second surface 20b by a leveling method such as a grinding method, such that the surface 22a of the conductive elements 22 is flush with the second surface 20b of the carrier body 20.

Figure 3A:
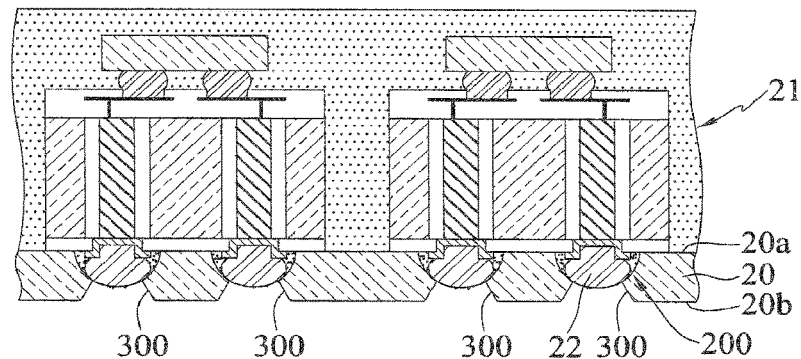
FIGS. 3A and 3B is another method of FIGS. 2C and 2D; wherein FIG. 3B' is another example of FIG. 3B.

Alternatively, the portion of the carrier body 20 is removed from the second surface 20b by a drilling method. As shown in FIG. 3A, a plurality of opening 300 are formed with respect to each of the recessed portions 200, such that the conductive elements 22 are exposed from the opening 300. Many methods can be used for the drilling process, such as etching or laser, without any particular limitations.

Figure 2D:
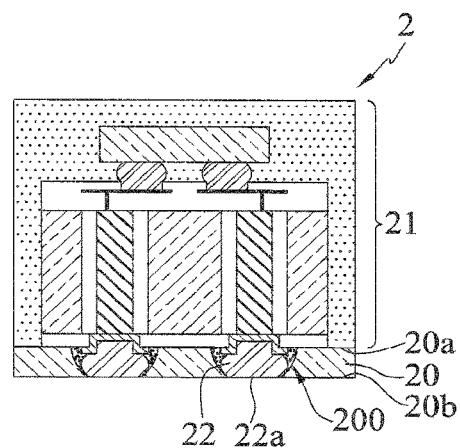

As shown in FIG. 2D, following the procedures described in FIG. 2C, a singulation process is performed, cutting along the cutting pathway S as shown in FIG. 2C, to obtain a plurality of electronic packages 2.

Figure 3B:
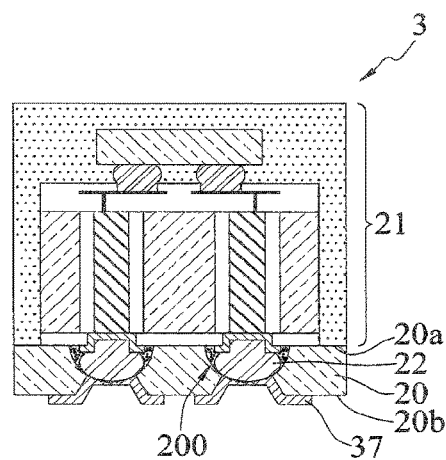
Figure 3B:
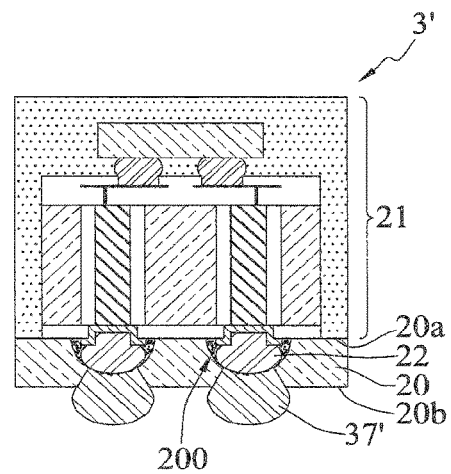

In an embodiment, following the procedures described in FIG. 3A, electronic package 3, 3' is obtained as shown in FIGS. 3B and 3B', respectively, a plurality of conductors 37, 37' are formed in the openings 300, and the conductors 37, 37' are wiring structures (as shown in FIG. 3B) or conductive bumps made by solder materials (as shown in FIG. 3B').

Figure 2E:
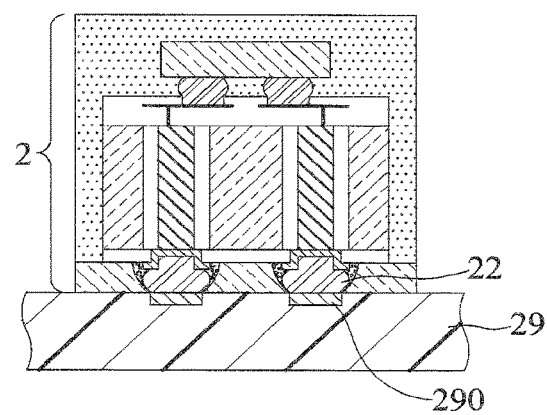
FIG. 2E is a schematic cross-sectional view showing a subsequent process of FIG. 2D.

In an embodiment, in the subsequent processes, as shown in FIG. 2E, the electronic package 2 is electrically connected to an electronic device 29 such as a package substrate via the conductive elements 22, and the electronic device 29 has a plurality of conductive pads 290 that are coupled with the conductive elements 22.

The method according to the present invention is characterized in that the electronic structure 21 is secured to the conductive elements 22, the conductive elements 22 are received in the recessed portions 200, the carrier body 20 and the bonding material 26 are retained, without the need of removing the carrier body 20 and bonding material 26, and no temporary material (such as the conventional carrier and adhesives) is required. Therefore, the method has fewer steps and less process time, as compared with the method according to the prior art. Besides, the materials for making the carriers are saved, and the electronic package thus fabricated has a low cost.

Moreover, since the carrier body 20 and the bonding material 26 are removed, no adhesive residue is left.

FIGS. 4A-4E are schematic cross-sectional views showing a method of fabricating an electronic package according to a second embodiment of the present invention. Only the difference between the second embodiment and the first embodiment will be illustrated below.

Figure 4A:
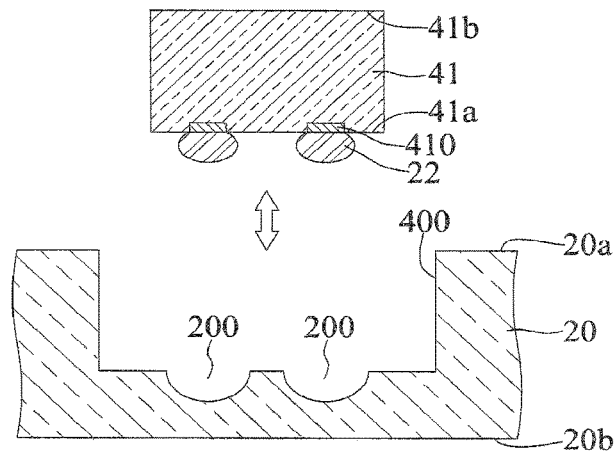
FIGS. 4A-4E are schematic cross-sectional views showing a method of fabricating an electronic package according to a second embodiment of the present invention; wherein FIG. 4E' is another example of FIG. 4E.

As shown in FIG. 4A, an electronic structure 41 is provided. The electronic structure 41 has a plurality of conductive elements 22 and a carrier body 20. The carrier body 20 has a first surface 20a and an opposing second surface 20b, and plurality of recessed portions 200 are formed in the carrier body 20 via the first surface 20a thereof.

In an embodiment, the carrier body 20 is formed with a recess 400 via the first surface thereof, the electronic structure 41 is received in the recess 400, and the recessed portions 200 communicate the recess 400.

In an embodiment, the electronic structure 41 is an active component, a passive component, or a combination thereof, the active component is a semiconductor chip, and the passive component is a resistor, a capacitor and an inductor. In another embodiment, the electronic structure 41 is a semiconductor chip that has an active surface 41a and an opposing non-active surface 41b, and the active surface 41a has a plurality of electrode pads 410 formed thereon and electrically connected with the conductive elements 22.

Figure 4B:
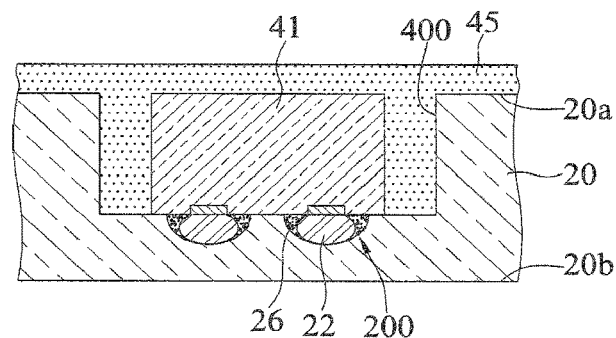

As shown in FIG. 4B, the electronic structure 41 is disposed in the opening 400, and the conductive elements 22 are received in the recessed portions 200. Subsequently, an insulating layer 45 is formed in the opening 400 and encapsulates the electronic structure 41.

In an embodiment, a bonding material 26 such as an underfill is secured to the conductive elements 22 in the recessed portions 200, so as to be secured to the electronic structure 41 in the opening 400.

In an embodiment, the insulating layer 45 is further formed on the first surface 20a on the opening 400. The insulating layer 45 is made of a polyimide (PI), a dry film, an epoxy resin, or an encapsulating material.

Figure 4C:
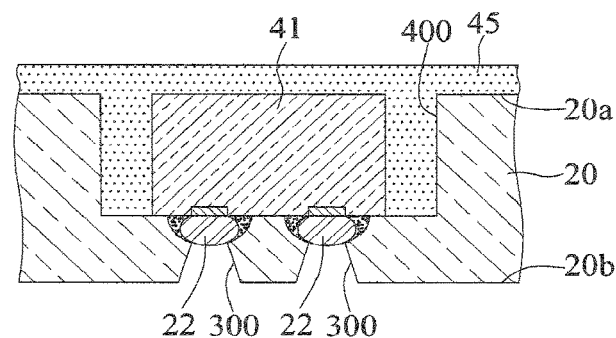

As shown in FIG. 4C, a drilling process is performed to form a plurality of openings 300 that correspond to the recessed portions 200, and the conductive elements 22 are exposed from the openings 300.

Figure 4D:
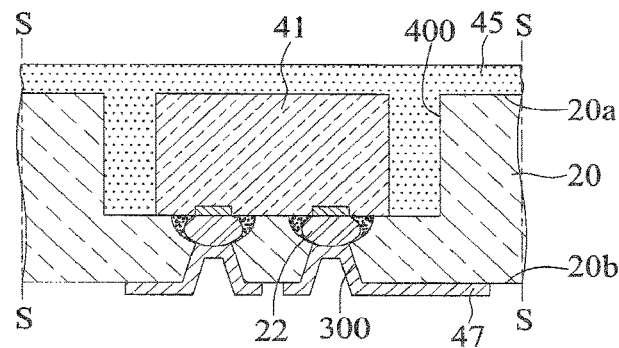

As shown in FIG. 4D, conductors 47 are formed on the second surface 20b of the carrier body 20 and in the openings 300, and are electrically connected with the conductive elements 22.

In an embodiment, the conductors 47 include a redistribution layer (RDL).

Figure 4E:
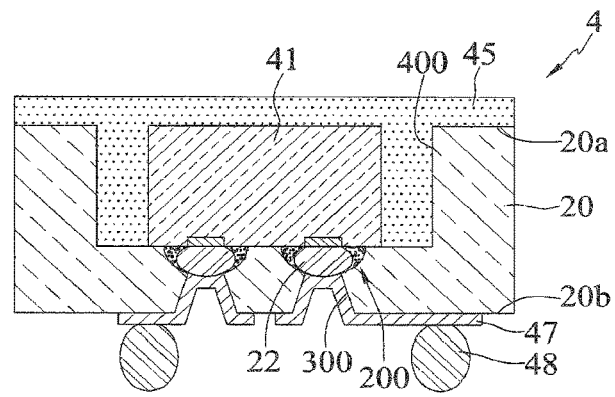
Figure 4E:
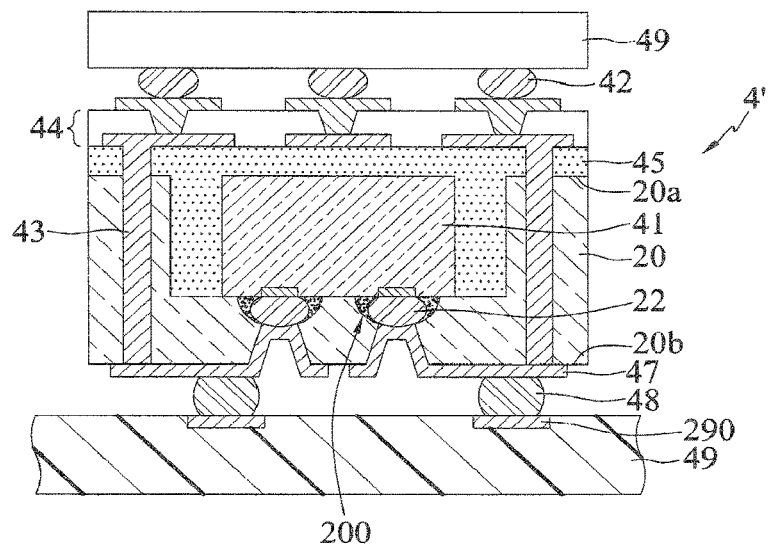

As shown in FIG. 4E, a plurality of conductive elements 48 such as solder balls are formed on the conductor 47, followed by a singulation process along the cutting path S as shown in FIG. 4D, to obtain the electronic package 4.

In an embodiment, in the subsequent processes, as shown in FIG. 4E', the electronic package 4 is coupled and electrically connected with the conductive pads 290 of the electronic device 29 via the conductive elements 48.

Further, in other embodiments, as shown in FIG. 4E', a plurality of conductive vias 43 are further formed through the carrier body 20 and the insulating layer 45, a wiring structure 44 is formed on the first surface 20a of the carrier body 20, and the conductive vias 43 are coupled with the first and second surfaces 20a and 20b of the carrier body 20, so as to electrically connect the wiring structure 44 with the conductor 47.

In an embodiment, the wiring structure 44 is fabricated by a redistribution layer (RDL) process, and another electronic device 49, such as a package structure and a chip, can be stacked over the wiring structure 44 via a plurality of conductive elements 42 such as solder balls.

The method according to the present invention is characterized in that the electronic structure 41 is secured to the conductive elements 22, the conductive elements 22 are received in the recessed portions 200, and the carrier body 20 and the bonding material 26 are retained, without the need of removing the carrier body 20 and bonding material 26. In other words, no temporary material (such as a conventional carrier and the adhesive) is required. Compared with the prior art, the present invention requires less steps and less time for production, does consumes materials for making the carrier, and has the fabrication cost reduced.

Further, since the carrier body 20 and bonding material 26 are removed, no residue of adhesive is left.

The present invention further provides an electronic package 2, 3, 3', 4, 4', comprising: a carrier body 20, an electronic structure 21, 41, and a plurality of conductive elements 22.

The carrier body 20 has a first surface 20a and an opposing second surface 20b, and the first surface 20a has a plurality of recessed portions 200 coupled with the second surface 20b. In an embodiment, the carrier body 20 is a semiconductor board.

The electronic structure 21, 41 is mounted on the first surface 20a of the carrier body 20.

Formed on the electronic structure 21, 41, the conductive elements 22 are received in the recessed portions 200, and exposed from the second surface 20b of the carrier body 20.

In an embodiment, the electronic structure 21 comprises at least one interposer 23 having the conductive elements 22, an electronic element 24 formed on the interposer 23, and an insulating layer 25 encapsulating the interposer 23 and the electronic elements 24.

In an embodiment, the conductive elements 22 are secured to the recessed portions 200 via a bonding material 26.

In an embodiment, the surfaces 22a of the conductive elements 22 are flush with the second surface 20b of the carrier body 20.

In an embodiment, a plurality of opening 300 are formed on the second surface 20b of the carrier body 20 with respect to the recessed portions 200, the conductive elements 22 are exposed from the openings 300, and the conductors 37, 37', 47 are formed in the openings 300.

In an embodiment, the electronic structure 41 is an active component, a passive component, or a combination thereof.

In an embodiment, a recess 400 is formed in the carrier body 20 via the first surface 20a thereof, an electronic structure 41 is received in the recess 400, and the recessed portions 200 are formed on the bottom surface of the recess 400. The electronic package 4, 4' further comprises an insulating layer 45 formed in the recess 400 and encapsulating the electronic structure 41.

In an embodiment, the electronic package 4' further comprises a plurality of conductive vias 43 formed in the carrier body 20.

In an embodiment, the electronic package 4' further comprises a wiring structure 44 formed on the first surface 20a of the carrier body 20.

In summary, the method of fabricating the electronic package according to the present invention is characterized in that the conductive elements formed on the electronic structure are received in the recessed portions correspondingly, and the carrier body is retained, without the need of removing the carrier body. In other words, no temporary material (such as the carrier in the prior art and an adhesive) is required. Compared with the prior art, the present invention requires less steps and less time for production, does not consume materials for making the carrier, and has the fabrication cost reduced.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of fabricating an electronic package, comprising:
   providing a carrier body having a first surface, a second surface opposing the first surface, and a plurality of recessed portions formed via the first surface;
   providing an electronic structure having a plurality of conductive elements;
   disposing on the first surface of the carrier body the electronic structure via the conductive elements, in a manner that each of the conductive elements is correspondingly received in each of the recessed portions; and
   after disposing on the first surface of the carrier body the electronic structure via the conductive elements, removing a portion of the carrier body from the second surface, allowing the conductive elements to be exposed from the second surface of the carrier body.

2. The method of claim 1, wherein the carrier body is a semiconductor board.

3. The method of claim 1, wherein the electronic structure comprises at least one interposer having the conductive elements, and an electronic element formed on the interposer.

4. The method of claim 3, wherein the electronic structure further comprises an insulating layer that encapsulates the interposer and the electronic element, with the conductive elements protruding from the insulating layer.

5. The method of claim 1, wherein the conductive elements are secured to the recessed portions via a bonding material.

6. The method of claim 1, wherein the portion of the carrier body is removed from the second surface by a leveling method, allowing surfaces of the conductive elements to be flush with the second surface of the carrier body.

7. The method of claim 1, wherein the portion of the carrier body is removed from the second surface by forming in the carrier body a plurality of openings, in a way that each of the openings communicates with a corresponding one of the recessed portions, such that the conductive elements are exposed from the openings.

8. The method of claim 7, further comprising forming a plurality of conductors in the openings.

9. The method of claim 1, wherein the electronic structure is an active component, a passive component, or a combination thereof.

10. The method of claim 1, wherein the carrier body is further formed with a recess via the first surface thereof, the electronic structure is received in the recess, and the recessed portions are formed to communicate with the recess.

11. The method of claim 10, further comprising forming in the recess an insulating layer that encapsulates the electronic structure.

12. The method of claim 1, further comprising forming a plurality of conductive vias in the carrier body.

13. The method of claim 1, further comprising forming a wiring structure on the first surface of the carrier body.

* * * * *